United States Patent
Inoue (10) Patent No.: US 6,900,709 B2
(45) Date of Patent: May 31, 2005

(54) SURFACE ACOUSTIC WAVE DEVICE

(75) Inventor: Kazuhiro Inoue, Moriyama (JP)

(73) Assignee: Murata Manufacturing Co., Ltd., Kyoto (JP)

(*) Notice: Subject to any disclaimer, the term of this patent is extended or adjusted under 35 U.S.C. 154(b) by 135 days.

(21) Appl. No.: 10/178,220

(22) Filed: Jun. 25, 2002

(65) Prior Publication Data

US 2003/0006863 A1 Jan. 9, 2003

(30) Foreign Application Priority Data

Jun. 25, 2001 (JP) .................................... 2001-190723

(51) Int. Cl.[7] .............................................. H03H 9/00
(52) U.S. Cl. .................................. 333/193; 310/313 R
(58) Field of Search ................................ 333/193, 195; 310/311, 313 R, 313 A, 313 B, 364; 29/25.35; 117/13

(56) References Cited

U.S. PATENT DOCUMENTS

| | | |
|---|---|---|
| 4,144,183 A | 3/1979 | Koch et al. |
| 4,243,540 A | 1/1981 | Mancini et al. |
| 4,448,700 A | 5/1984 | Lankamp |
| 4,627,192 A | 12/1986 | Fick |
| 4,783,274 A | 11/1988 | Jokinen et al. |
| 4,832,975 A | 5/1989 | Yang |
| 5,258,197 A | 11/1993 | Wheeler et al. |
| 5,282,989 A | 2/1994 | Erickson et al. |
| 5,346,724 A | 9/1994 | Ohgake et al. |
| 5,413,725 A | 5/1995 | Lal et al. |
| 5,451,334 A | 9/1995 | Bongardt et al. |
| 5,549,836 A | 8/1996 | Moses |
| 5,589,217 A | 12/1996 | Mazurek |
| 5,716,916 A | 2/1998 | Shiokawa et al. |
| 5,721,199 A | 2/1998 | Moses |
| 5,767,338 A | 6/1998 | Fan |
| 5,773,391 A | 6/1998 | Lawate et al. |
| 5,861,187 A | 1/1999 | Debonte et al. |
| 5,867,074 A * | 2/1999 | Ogiso et al. ................ 333/193 |
| 6,037,847 A * | 3/2000 | Ueda et al. ................. 333/193 |
| 6,339,277 B1 * | 1/2002 | Iwamoto et al. ........ 310/313 R |
| 6,402,834 B1 * | 6/2002 | Nagai et al. ................. 117/13 |

FOREIGN PATENT DOCUMENTS

| | | |
|---|---|---|
| EP | 0 843 300 A1 | 5/1998 |
| JP | 05-022067 | 1/1993 |
| JP | 5-055303 | 3/1993 |
| JP | 05-090882 | 4/1993 |
| JP | 2001-094382 | 4/2001 |
| WO | WO 93/07240 | 4/1993 |
| WO | WO 96/07632 | 3/1996 |
| WO | WO 97/40698 | 11/1997 |
| WO | WO 98/07679 | 2/1998 |
| WO | WO 98/07680 | 2/1998 |
| WO | WO00/24123 | 4/2000 |

OTHER PUBLICATIONS

Singleton et al, "Data Storage Applications," 1999, Journal of Applied Physics, vol. 85, No. 8.*

* cited by examiner

Primary Examiner—Patrick Wamsley
(74) Attorney, Agent, or Firm—Keating & Bennett, LLP (57) ABSTRACT

A surface acoustic wave device includes a surface acoustic wave element and a sealing member for sealing the surface acoustic wave element. The surface acoustic wave element has a piezoelectric substrate and an electrode provided on the piezoelectric substrate. The sealing ember is made of a resin or glass. The electrode has an electrode layer made of Al or an Al alloy and includes crystals having a twin structure.

20 Claims, 6 Drawing Sheets

SURFACE ACOUSTIC WAVE DEVICE

BACKGROUND OF THE INVENTION

1. Field of the Invention

The present invention relates to surface acoustic wave devices, such as surface acoustic wave resonators and surface acoustic wave filters, in which a surface acoustic wave element is sealed with a sealing member. In particular, the present invention relates to improvements in materials of the sealing member and in the crystal structure of an electrode of the surface acoustic wave element.

2. Description of the Related Art

As is generally known, a surface acoustic wave element is an electronic component utilizing a surface acoustic wave, which is generated by a mechanical vibrational energy concentrated in the vicinity of a solid surface and which is transmitted. In general, the surface acoustic wave element includes a piezoelectric substrate and an electrode for applying and transferring a signal, such as an interdigital electrode or a grating electrode, provided on the piezoelectric substrate.

The electrode is generally formed of aluminum (Al), which has a low electrical resistance and a low specific gravity, or an alloy primarily containing Al.

The surface acoustic wave element is, in practice, sealed in a package to define a surface acoustic wave device and is delivered as a finished product.

In general, the surface acoustic wave element is provided in a ceramic package with a metallic cover fixed by seam welding, and is thus, hermetically sealed.

However, an expensive ceramic package is required for such a packaging structure and the surface acoustic wave device cannot be easily miniaturized.

To provide inexpensive miniaturized surface acoustic wave devices, Japanese Unexamined Patent Application Publication No. 5-90882 discloses a packaging structure in which the functional surface of the piezoelectric substrate of the surface acoustic wave element, having the electrode thereon, is sealed with a resin or glass. This structure is commonly used.

However, resins and glass do not ensure hermetic sealing. Moisture penetrating from the outside through the resin or glass often reacts with the electrode on the piezoelectric substrate to change the operating frequency of the surface acoustic wave element, or gases from the resins or the glass cause corrosion of the electrode. Thus, the characteristics of the surface acoustic wave element deteriorate.

In order to prevent the moisture from reacting with the electrode, it is suggested that tantalum (Ta) or other suitable materials be provided in the Al electrode. Also, Japanese Unexamined Patent Application Publication No. 5-22067 suggests that the electrode be coated with a $SiO_2$ protective film.

Unfortunately, the above-described additives for improving the corrosion resistance and moisture resistance of the electrode increases the electrical resistance of the electrode, thereby degrading the characteristics of the surface acoustic wave element.

Also, the protective film increases the weight of the electrode, thereby degrading the characteristics of the surface acoustic wave element.

If the moisture resistance and corrosion resistance of the electrode is improved without degrading the characteristics of the surface acoustic wave element, by sealing the element with a resin or glass, a miniaturized surface acoustic wave device having excellent characteristics can be achieved at low cost.

SUMMARY OF THE INVENTION

In order to overcome the above-described problems, preferred embodiments of the present invention provide an inexpensive miniaturized surface acoustic wave device having excellent characteristics.

In order to improve the stress migration resistance of an Al electrode, and thus, to improve the electric power resistance, the inventors have directed their attention to the crystal structure of the electrode. As a result, the inventors discovered that an electrode having a twin crystal structure exhibits excellent stress migration resistance. Furthermore, the inventors discovered that the twin-structure electrode greatly improves the moisture resistance and corrosion resistance, in addition to the stress migration resistance.

Therefore, by sealing the electrode having a twin structure using a resin or glass, a surface acoustic wave device that satisfies the above-described requirements is achieved.

Accordingly, preferred embodiments of the present invention provide a surface acoustic wave device including a surface acoustic wave element including a piezoelectric substrate having a functional surface and an electrode disposed on the functional surface.

The electrode includes an electrode layer including crystals having a twin crystal structure. A sealing member made of a resin or a glass is provided to seal the functional surface. The sealing member is provided to protect the functional surface on which the electrode is provided.

The surface acoustic wave device preferably further includes a wiring board. The surface acoustic wave element is mounted on the wiring substrate such that the functional surface of the piezoelectric substrate faces the wiring substrate with a desired clearance between the functional surface and the wiring substrate. The sealing member covers the surface acoustic wave element and seals the space defined by the clearance.

Preferably, the electrode layer includes Al or an alloy primarily including Al.

Preferably, the electrode further includes an underlayer to improve the crystallinity of Al, and the underlayer is provided between the electrode layer and the piezoelectric substrate. Preferably, the underlayer primarily includes at least one of Ti and Cr.

Preferably, the piezoelectric substrate includes a $LiNbO_3$ single crystal or $LiTaO_3$ single crystal.

Other feature, elements, characteristics and advantages of the present invention will become more apparent from the following detailed description of preferred embodiments of the present invention with reference to the attached drawings.

DETAILED DESCRIPTION OF PREFERRED EMBODIMENTS

Figure 1:
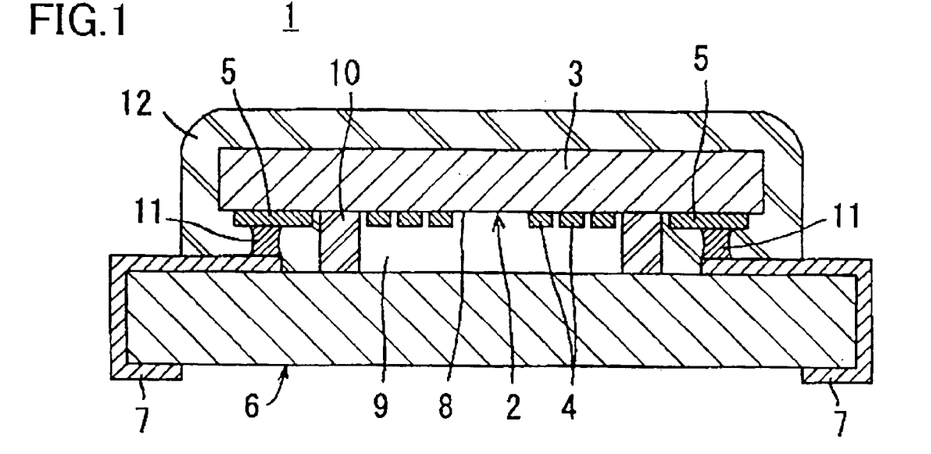
FIG. 1 is a sectional view of a surface acoustic wave device according to a preferred embodiment of the present invention.

FIG. 1 is a sectional view of a surface acoustic wave device 1 according to a preferred embodiment of the present invention.

The surface acoustic wave device 1 preferably includes a surface acoustic wave element 2. The surface acoustic wave element 2 has a piezoelectric substrate 3 made of, for example, a single crystal of $LiNbO_3$ or $LiTaO_3$, or other suitable material. On the piezoelectric substrate 3, an electrode 4, which may have an interdigital structure, and input/output terminals 5 electrically connected to the electrode 4 are provided.

The surface acoustic wave device 1 also includes a wiring board 6. The wiring board 6 is made of, for example, a glass-epoxy material and is provided with external connecting terminals 7 on ends thereof. The external connecting terminals 7 are conductive films extending from one surface to the other surface of the wiring board 6.

The surface acoustic wave element 2 is mounted on the wiring board 6 such that a functional surface 8 of the piezoelectric substrate 3, on which the electrode 4 is provided, faces the wiring board 6 with a desired clearance 9 therebetween. The clearance 9, which is defined by spacers 10 provided between the piezoelectric substrate 3 and the wiring board 6, permits the piezoelectric substrate 3 to vibrate. The spacers 10 are preferably rings made of, for example, silicone rubber. The input/output terminals 5 of the surface acoustic wave element 2 are connected to the external connecting terminals 7 on the wiring board 6 with a conductive bond 11, such as a solder bump or a conductive paste.

The surface acoustic wave device 1 also includes a sealing member 12 for sealing the surface acoustic wave element 2. The sealing member 12 is preferably made of a resin or glass by, for example, potting. The sealing member 12 is arranged so as to cover the surface acoustic wave element 2 and to seal the clearance 9 from the outside.

The electrode 4 of the surface acoustic wave element 2 has an electrode layer including crystals having a twin structure, such that the moisture resistance and the corrosion resistance thereof are greatly improved. This will now be described in detail with reference to FIGS. 2 to 4.

Figure 2:
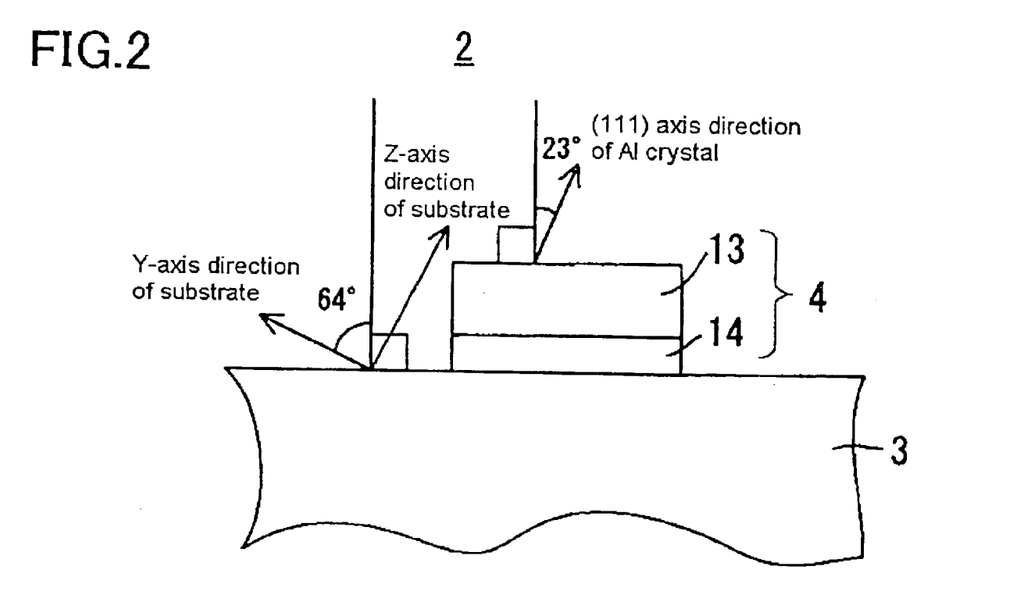
FIG. 2 is a fragmentary sectional view of a surface acoustic wave element of the surface acoustic wave device shown in FIG. 1.

FIG. 2 is a fragmentary sectional view of the surface acoustic wave element 2 of the surface acoustic wave device 1 shown in FIG. 1, and shows the electrode 4 provided on the piezoelectric substrate 3. FIGS. 1 and 2 are views from opposite directions.

The electrode 4 includes an electrode layer 13 preferably made of Al or an alloy primarily including Al and an underlayer between the electrode layer 13 and the piezoelectric substrate 3. The underlayer 14 improves the crystallinity of Al. The underlayer 14 primarily includes, for example, at least one of Ti and Cr.

For example, when a single crystal substrate of 64° Y-X cut $LiNbO_3$ is used for the piezoelectric substrate 3, the Y-axis and the Z-axis of the crystal point in the directions shown by arrows in FIG. 2. The x-axis extends in the direction that is perpendicular to the drawing.

In a process for forming the electrode 4 on the piezoelectric substrate 3, the surface of the piezoelectric substrate 3 is subjected to a pretreatment, such as ion etching, to remove a layer having a thickness of several nanometers by grinding or other suitable method. Thus, crystal surfaces that are capable of epitaxial growth are exposed at the surface of the piezoelectric substrate 3.

Figure 3:
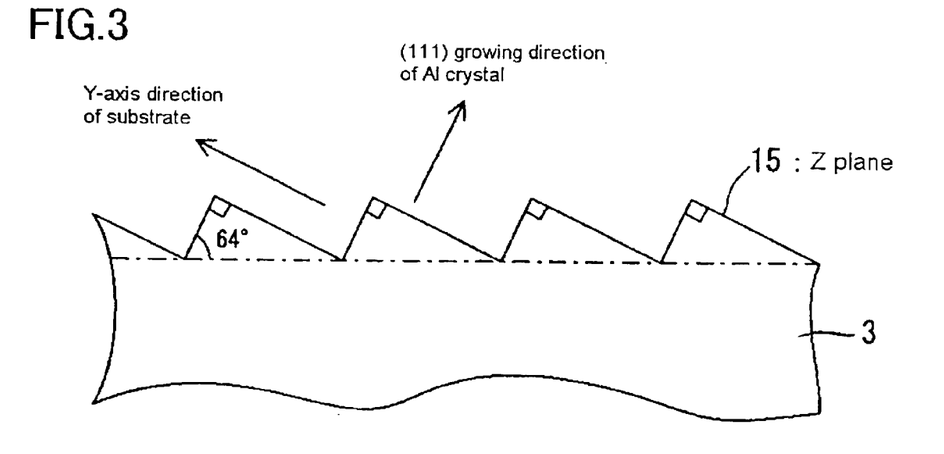
FIG. 3 is a schematic sectional view of a surface of a piezoelectric substrate included in the surface acoustic wave element shown in FIG. 2, showing Z surfaces which are exposed after removing a degraded layer formed by processing the surface.
Figure 4:
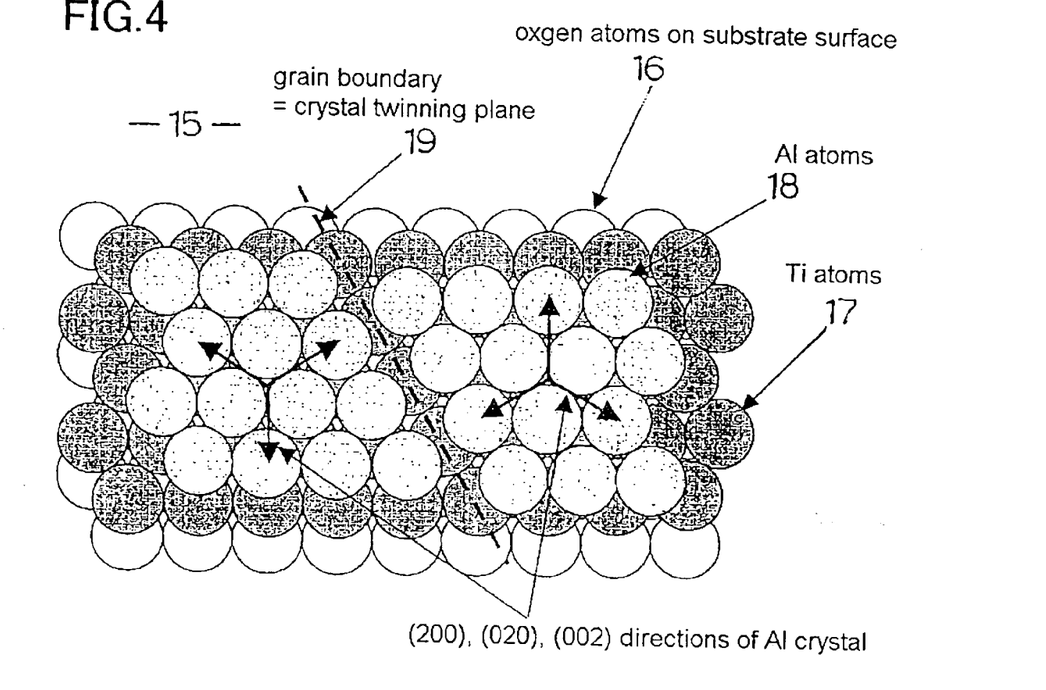
FIG. 4 is a schematic plan view of a Z surface shown in FIG. 3, showing oxygen atoms, titanium atoms serving as an underlayer, and aluminum atoms serving as an electrode layer deposited on the Z surface in that order.

As a result, the surface of the piezoelectric substrate 3 has a microscopic stepped structure in which the Z surfaces 15 are terraces, as shown in FIG. 3. Oxygen atoms, which are illustrated by white circles in FIG. 4, are arrayed on the top surface of the Z surfaces 15 at intervals of about 0.297 nm.

The underlayer 14 is deposited on the Z surfaces 15. When the underlayer 14 is, for example, a Ti layer having a hexagonal close packed structure with an interatomic distance of at least about 0.292 nm, the (001) surfaces of the crystals of Ti atoms 17, which are illustrated by dark-tone dot meshed circles in FIG. 4, grow to form an epitaxial layer in the direction that is substantially parallel to the Z surfaces 15 of the piezoelectric substrate 3.

Since the shortest interatomic distance between Ti atoms 17 is substantially the same as that of oxygen atoms 16 on the Z surfaces 15 of the $LiNbO_3$ piezoelectric substrate 3, the underlayer 14 is formed as a Ti thin layer having excellent crystallinity.

Ti atoms 17 readily bond with oxygen atoms 16, and the shortest interatomic distance therebetween is closer to that of oxygen atoms 16 on the $LiNbO_3$ piezoelectric substrate 3 rather than that of Al atoms. Therefore, forming the underlayer 14 results in the electrode layer 13 having greatly improved crystallinity, in contrast to forming the electrode layer directly on the piezoelectric substrate 3. In practice, the underlayer 14 includes tens of atomic layers of Ti atoms, and FIG. 4 shows a (001) surface of the lowermost layer of the Ti atoms 17.

The underlayer 14 is formed at a temperature of about 100° C. or less by vacuum deposition. If the vacuum deposition is performed at a temperature of more than about 100° C., the orientation direction of the Ti atoms 17 changes such that (111) or (100) surfaces of the Al crystals of the electrode layer 13 grow in the direction that is substantially perpendicular to the piezoelectric substrate 3, as described later. Thus, excellent crystallinity is not obtained.

Next, the electrode layer 13 is formed of Al or an alloy primarily including Al on the underlayer 14. Specifically, when Al having a surface-centered cubic structure with an interatomic distance of at least about 0.286 nm is formed on the underlayer 14, in which Ti atoms 17 are arrayed, the (111) surfaces of the Al atoms 18, which are illustrated by light-tone dot-meshed circles in FIG. 4, grow to form an epitaxial layer in the direction that is substantially parallel to the (001) surfaces of the crystals of the Ti atoms 17.

As a result, depending upon the way the Al atoms 18 are arrayed, the electrode layer 13 is formed to have a crystal structure such that two crystals with a different orientation from each other are rotated by 180° about an axis extending in the direction of the Z axis of the piezoelectric substrate 3, as shown in FIG. 4. This crystal structure is generally designated as a twin structure. The two orientations described above each occur at a probability of one half, and the resulting electrode layer 13 includes a polycrystal having grain boundaries, that is, twinning planes, at the position shown by a heavy dotted line 19.

FIG. 4 shows the (200), (020), and (002) directions of Al crystals with arrows. In practice, these axes incline about 35° with respect to the drawing and are not illustrated in FIG. 4.

Thus, the Al or Al alloy electrode layer 13 is formed on the piezoelectric substrate 3 of 64° Y-X cut $LiNbO_3$ such that the (111) surfaces thereof grow in parallel with the Z surfaces 15 of the piezoelectric substrate 3 to have a twin structure, as shown in FIG. 2.

The twin structure leads to increased mechanical strength because the crystallographic axes are oriented in different directions, and the epitaxial twin structure prevents grain boundary diffusion thereof. In general, it is known that the presence of the grain boundaries generally degrades stress migration resistance. However, since the crystallographic axes of two adjacent crystal grains are advantageously arranged in this preferred embodiment, the grain boundaries are very narrow and thus prevent the crystal grains from causing self-diffusion.

Thus, the electrode layer 13 has excellent stress migration resistance and excellent moisture and corrosion resistances.

In this preferred embodiment, the piezoelectric substrate 3 is preferably formed of 64° Y-X cut $LiNbO_3$. However, another substrate having a different cut angle may be used because the substrate can be subjected to a pretreatment to remove a degraded layer formed by processing the surface thereof such that crystal surfaces capable of epitaxial growth are exposed. Also, a $LiTaO_3$ substrate, which has a similar crystal structure to the $LiNbO_3$ substrate, produces the same effect. In addition, substrates other than $LiNbO_3$ and $LiTaO_3$ may be used as a piezoelectric substrate.

The electrode layer 13 is made of Al or an Al alloy in the preferred embodiment. In the case of an Al alloy, preferably, a small amount of material to improve the stress migration resistance, such as Cu, Mg, Ni, or Mo, is added to the Al alloy.

The underlayer 14 is made of Ti in the preferred embodiment, but it may be made of an alloy mainly including Ti. Alternatively, another metal capable of improving Al crystallinity, such as Cr or a Cr alloy, may be used.

In addition, an insulating layer which does not degrade the characteristics may be provided on the surface of the electrode 4 to adjust the operating frequency of the surface acoustic wave element 2.

An example of preferred embodiments of the present invention will now be described.

In order to prepare a surface acoustic wave element for a surface acoustic wave filter device according to the preferred embodiment of the present invention, first, a piezoelectric substrate made of 64° Y-X cut $LiNbO_3$ was subjected to a pretreatment by ion etching to remove a degraded layer having a thickness of several nanometers formed by processing the surface thereof.

Next, a Ti underlayer was deposited to a thickness of about 5 nm on the piezoelectric substrate at about 50° C. by electron beam vapor deposition, and subsequently, an Al electrode layer was formed to a thickness of about 200 nm. An electrode was thereby formed on the piezoelectric substrate.

Figure 5:
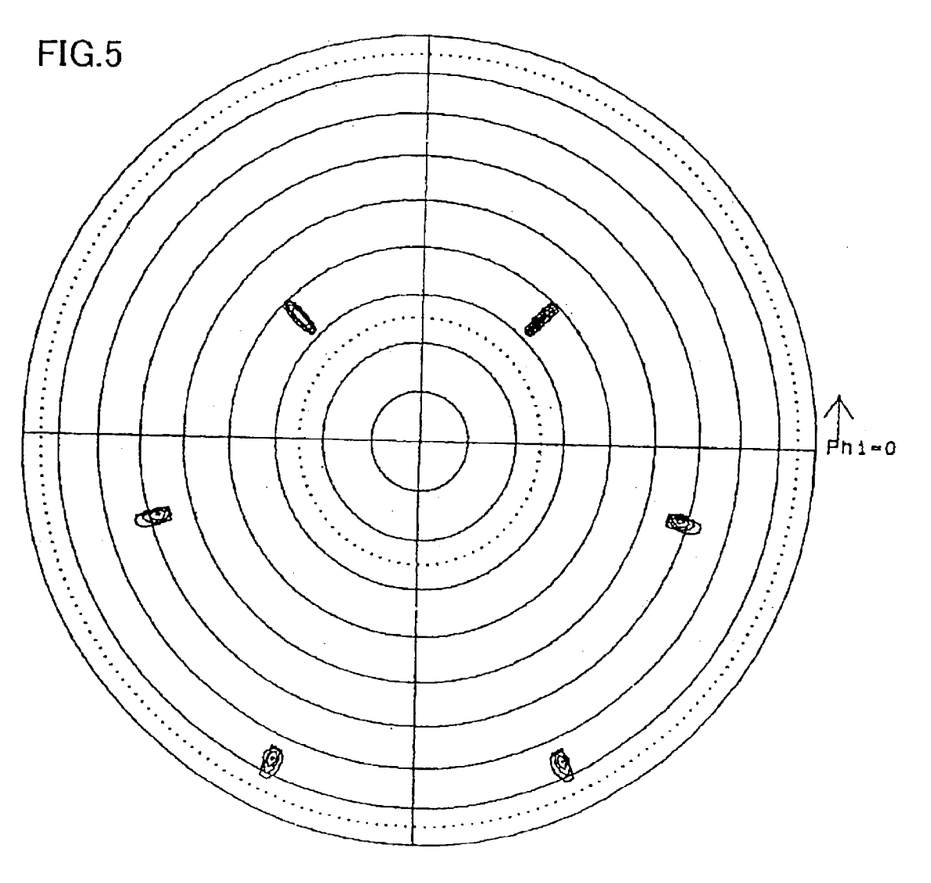
FIG. 5 is an X-ray diffraction (XRD) pole figure of an Al electrode layer according to an example of preferred embodiments of the present invention.

FIG. 5 shows an XRD pole figure of the electrode layer. FIG. 5 illustrates that the reflection at a (200) surface of the Al electrode layer exhibited spots and a triaxial orientation. Also, FIG. 5 shows that the reflection at the (200) surface exhibits six symmetrical spots, and therefore, the Al crystal has a twin structure having two different crystal orientations such that the crystal rotates by 180° on the (111) axis. Therefore, the (111) axes of the Al electrode layer incline about 23° with respect to the normal of the substrate, and the (111) surfaces of the Al electrode layer grow in substantially the same direction as in the Z axis of the $LiNbO_3$ piezoelectric substrate to form an epitaxial layer.

On the other hand, as a Comparative Example, Ti and Al were deposited, in that order, at about 200° C. on a piezoelectric substrate which was not subjected to pretreatment by ion etching to form an electrode including an underlayer and an electrode layer.

Figure 6:
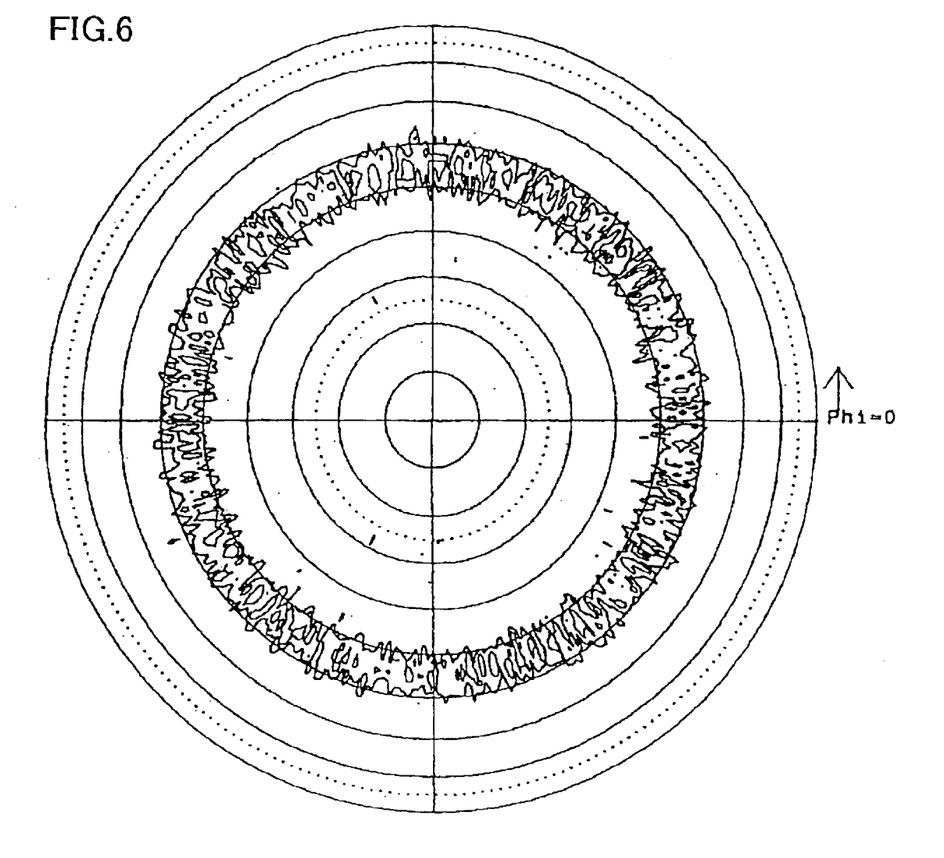
FIG. 6 is an XRD pole figure of an Al electrode according to a comparative example.

FIG. 6 shows an XRD pole figure of the electrode layer of Comparative Example. As shown in FIG. 6, the XRD pole figure shows a circular pattern and illustrates that the Al electrode layer exhibited a single-axis orientation in which a (111) surface of Al grew in the direction that is perpendicular to the substrate.

Next, the electrodes of the Example and the Comparative Example were subjected to photolithography and etching to produce an interdigital shape.

Then, the piezoelectric substrates were split by dicing and were connected to external connecting terminals on the wiring board through solder bumps provided on the input/output terminals thereof. Then, a resin was applied and then dried to complete the surface acoustic wave filters, having a frequency of about 1.9 GHz, of Example and Comparative example, as shown in FIG. 1.

In order to investigate the moisture resistance and the corrosion resistance of the resulting surface acoustic wave filters, the filters were left at a temperature of about 125° C. and a humidity of about 90%. After predetermined periods of time had elapsed, the filters were subjected to an insertion loss test. Table 1 shows the results.

TABLE 1

|  | Insertion loss (dB) | | | |
| --- | --- | --- | --- | --- |
|  | Before test | After 100 h | After 500 h | After 1000 h |
| Embodiment | 1.8 | 1.8 | 1.8 | 1.8 |
| Comparative Example | 1.8 | 1.9 | 2.6 | — |

As shown in Table 1, the insertion loss of the Comparative Example began increasing at about 100 hours and eventually the loss increased by a large amount after about 500 hours. In contrast, the insertion loss of the Example did not increase even after 1000 hours.

Thus, the structure of the electrode significantly affects the moisture resistance and the corrosion resistance. Al, which is used for the electrode, forms an oxide layer thereon, thus having a certain degree of moisture resistance and corrosion resistance. However, depending upon heat and stress migration generated by use of the surface acoustic wave filter and environmental temperature, the electrode causes self-diffusion through the grain boundaries of Al crystals thereof. Thus, moisture or corrosive gases from the sealing member enter the electrode. The Comparative Example exhibited this state, thus increasing the insertion loss.

In contrast, in the Example, the electrode layer had a twin structure, and adjacent crystal grains forming this twin structure were arranged with each other. Thus, the grain boundaries became narrow, and consequently, self-diffusion did not occur through the grain boundaries. As a result, the electrode exhibited outstanding moisture resistance and corrosion resistance.

According to preferred embodiments of the present invention, by providing a twin structure to the electrode on the piezoelectric substrate, the moisture resistance and the corrosion resistance of the electrode are greatly improved.

Thus, even if the sealing member is made of a resin or glass, the electrical characteristics of the surface acoustic wave device are effectively maintained. Therefore, by using a resin or glass for the sealing member, a miniaturized inexpensive surface acoustic wave device is achieved.

Also, the electrode having a twin structure not only has excellent moisture resistance and corrosion resistance but also has excellent stress migration resistance, thus, improving the electric power resistance of the surface acoustic wave element. The electrode, therefore, needs no additives to improve the electric power resistance of the surface acoustic wave element, which unnecessarily increases the electric resistance, and does not need a multilayer structure. Thus, the electrode is particularly suited for surface acoustic wave devices used at high frequency and high electric power.

By forming the electrode layer of Al or an Al alloy, the electric resistance and the weight of the electrode is reduced, and thus, the surface acoustic wave element has greatly increased energy conversion efficiency.

By forming an underlayer mainly including Ti or Cr between the electrode layer and the piezoelectric substrate, the Al crystallinity of the electrode layer is further improved.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave device, comprising:
   a surface acoustic wave element including a piezoelectric substrate having a functional surface and en electrode provided on the functional surface, said electrode including an electrode layer including crystals having a twin crystal structure;
   the electrode layer comprises Al or an alloy primarily including Al;
   the piezoelectric substrate comprises a $LiNbO_3$ single crystal or $LiTaO_3$ single crystal;
   the (111) axes of the electrode layer are grown substantially in the same direction as the Z-axis of the piezoelectric substrate; and
   a sealing member sealing the functional surface, said sealing member being made of resin or glass.

2. A surface acoustic wave device according to claim 1, wherein the electrode layer comprises Al.

3. A surface acoustic wave device according to claim 2, wherein the electrode further comprises an underlayer for improving the crystallinity of Al, and said underlayer is provided between the electrode layer and the piezoelectric substrate.

4. A surface acoustic wave device according to claim 3, wherein the underlayer primarily includes Ti.

5. A surface acoustic wave device according to claim 3, wherein the underlayer primarily includes Cr.

6. A surface acoustic wave device according to claim 3, wherein the underlayer primarily includes at least one of Ti and Cr.

7. A surface acoustic wave device according to claim 1, further comprising a wiring substrate, wherein said surface acoustic wave element is mounted on said wiring substrate such that said functional surface of the piezoelectric substrate faces the wiring substrate with a desired clearance between said functional surface and said wiring substrate, and the sealing member covers the surface acoustic wave element and seals the space defined by the clearance.

8. A surface acoustic wave device according to claim 1, wherein the electrode layer comprises an alloy primarily including Al.

9. A surface acoustic wave device according to claim 1, wherein the piezoelectric substrate comprises a $LiNbO_3$ single crystal.

10. A surface acoustic wave device according to claim 1, wherein the piezoelectric substrate comprises a $LiTaO_3$ single crystal.

11. A surface acoustic wave device, comprising:
    a surface acoustic wave element including a piezoelectric substrate having a functional surface and an electrode provided on the functional surface, said electrode including an electrode layer including crystals having a twin crystal structure;
    the electrode layer comprises Al or an alloy primarily including Al;
    the piezoelectric substrate comprises a $LiNbO_3$ single crystal or $LiTaO_3$ single crystal;
    the (111) axes of the electrode layer are grown substantially in the same direction as the Z-axis of the piezoelectric substrate; and
    an underlayer for improving the crystallinity of the electrode, and said underlayer is provided between the electrode layer and the piezoelectric substrate.

12. A surface acoustic wave device according to claim 11, further comprising a sealing member sealing the functional surface, said sealing member being made of a resin and glass.

13. A surface acoustic wave device according to claim 12, further comprising a wiring substrate, wherein said surface acoustic wave element is mounted on said wiring substrate such that said functional surface of the piezoelectric substrate faces the wiring substrate with a desired clearance between said functional surface and said wiring substrate, and the searing member covers the surface acoustic wave element and seals the space defined by the clearance.

14. A surface acoustic wave device according to claim 11, wherein the electrode layer comprises Al.

15. A surface acoustic wave device according to claim 11, wherein the electrode layer comprises an alloy primarily including Al.

16. A surface acoustic wave device according to claim 11, wherein the underlayer primarily includes Ti.

17. A surface acoustic wave device according to claim 11, wherein the underlayer primarily includes Cr.

18. A surface acoustic wave device according to claim 11, wherein the underlayer primarily includes at least one of Ti and Cr.

19. A surface acoustic wave device according to claim 11, wherein the piezoelectric substrate comprises a $LiNbO_3$ single crystal.

20. A surface acoustic wave device according to claim 11, wherein the piezoelectric substrate comprises a $LiTaO_3$ single crystal.

* * * * *